United States Patent [19]
Suzuki et al.

[11] Patent Number: 5,901,101
[45] Date of Patent: May 4, 1999

[54] SEMICONDUCTOR MEMORY DEVICE

[75] Inventors: Takaaki Suzuki; Masao Nakano; Hiroyoshi Tomita; Yasuharu Sato; Kotoku Sato; Nobutaka Taniguchi, all of Kawasaki, Japan

[73] Assignee: Fujitsu Limited, Kawasaki, Japan

[21] Appl. No.: 08/919,505

[22] Filed: Aug. 28, 1997

[30] Foreign Application Priority Data

Aug. 29, 1996 [JP] Japan ................................ 8-229002
Aug. 13, 1997 [JP] Japan ................................ 9-218648

[51] Int. Cl.$^6$ ................................................ G11C 7/00
[52] U.S. Cl. .................... 365/222; 365/189.01; 365/233
[58] Field of Search ..................... 365/189.01, 189.07, 365/189.03, 195, 222, 201, 233

[56] References Cited

U.S. PATENT DOCUMENTS

| | | | |
|---|---|---|---|
| 5,418,754 | 5/1995 | Sakakibara | 365/222 |
| 5,469,386 | 11/1995 | Obara | 365/189.07 |
| 5,499,213 | 3/1996 | Niimi et al. | 365/222 |
| 5,563,837 | 10/1996 | Noguchi | 365/222 |
| 5,583,818 | 12/1996 | You et al. | 365/222 |
| 5,629,897 | 5/1997 | Iwamoto et al. | 365/195 |
| 5,644,544 | 7/1997 | Mizukami | 365/222 |

*Primary Examiner*—David Nelms
*Assistant Examiner*—Tuan T. Nguyen
*Attorney, Agent, or Firm*—Nikaido, Marmelstein, Murray & Oram LLP

[57] ABSTRACT

In a semiconductor memory device operable in synchronism with a clock signal externally supplied thereto, there are provided a first part which detects a state of a predetermined signal after a given command is input to the semiconductor memory; and a second part which sets, on the basis of the state of the predetermined signal, the semiconductor memory device to a self-refresh mode in which a refresh operation is carried out without an external signal.

11 Claims, 16 Drawing Sheets

FIG. 2A

CKE TRUTH TABLE

| Current State | Action | Command | CKE n-1 | CKE n | CS | RAS | CAS | WE | Addr |
|---|---|---|---|---|---|---|---|---|---|
| Bank Active | Clock Suspend Mode Entry | CSUS | H | L | x | x | x | x | x |
| Any State (Except to Idle) | Clock Suspend | | L | L | x | x | x | x | x |
| Clock Suspend | Clock Suspend Mode Exit | | L | H | x | x | x | x | x |
| Idle | Auto Refresh Command | REF | H | H | L | L | L | H | x |
| Idle | Self Refresh Entry | SELF | H | L | L | L | L | H | x |
| Self Refresh | Self Refresh Exit | SELFX | L | H | L | L | H | H | x |
| | | | L | H | H | x | x | x | x |
| Idle | Power Down Entry | PD | H | L | x | x | x | x | x |
| Power Down | Power Down Exit | | L | H | x | x | x | x | x |

(A)

x : don't care

FIG. 2B

DQM TRUTH TABLE

| Function | Command | CKE n-1 | CKE n | DQML | DQMU |
|---|---|---|---|---|---|
| Data Write/Output Enable for Lower Byte | ENBL L | H | x | L | x |
| Data Write/Output Enable for Upper Byte | ENBL U | H | x | x | L |
| Data Mask/Output Disable for Lower Byte | MASK L | H | x | H | x |
| Data Mask/Output Disable for Upper Byte | MASK U | H | x | x | H |

(B)

FIG. 16
(a) refpz 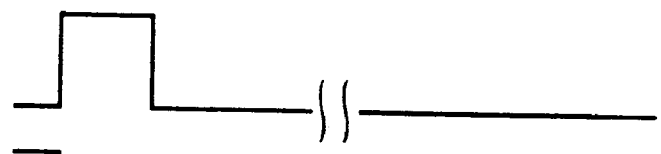
(b) node(b) 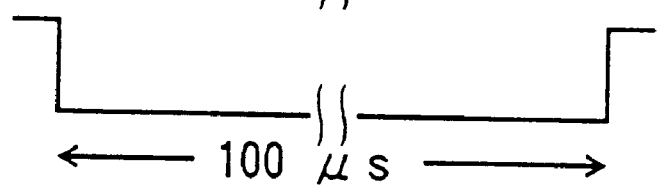
⟵ 100 μs ⟶
(c) oscz 
(d) clkmpx 
(e) 
(f) node(f) 
(g) node(g) 
(h) node(h) 

SEMICONDUCTOR MEMORY DEVICE

BACKGROUND OF THE INVENTION

1. Field of the Invention

The present invention generally relates to semiconductor memory devices, and more particularly to a synchronous dynamic random access semiconductor memory device (SDRAM device) capable of operating in synchronism with an external clock. More specifically, the present invention is concerned with a refresh operation of such an SDRAM device.

2. Description of the Related Art

Various types of semiconductor memory devices, such as SRAM and DRAM devices have been proposed and have been selectively used in terms of applications and so on. A recent advance of application programs and systems requires a large number of DRAM devices. Under the above situation, SDRAM devices have been attracted because the SDRAM devices can operate in synchronism with a very high-speed external clock.

The SDRAM devices require refresh operations as in the case of general-purpose DRAM devices. Recent DRAM devices are equipped with a plurality of refresh modes such as an automatic refresh (auto-refresh) mode and a self-refresh mode. In the auto-refresh mode, an external clock and an external address are needed to perform the auto-refresh operation. The self-refresh mode does not require the external clock and the external address. In the self-refresh mode, it is possible to hold data in a system standby state without any external signals.

The general-purpose DRAM devices have a mode selecting operation in which given signals such as a column address strobe signal (/CAS) and a row address strobe signal (/RAS) are controlled at given timings. The above operation is called a command entry. For example, a CAS-before-RAS command entries the auto-refresh mode. The self-refresh mode can be entered by holding the /CAS signal during a given time after the CAS-before-RAS command. It should be noted that the symbol "/" denotes a low-active signal.

In the SDRAM devices, the auto-refresh mode and the self-refresh mode can be entered by controlling a clock enable signal CKE, a chip select signal /CS, a write enable signal /WE, the /CAS signal and /RAS signal. The clock enable signal CKE is used to make a decision as to whether an external synchronizing clock signal CLK should be received. For example, the auto-refresh mode can be entered when the clock enable signal CKE is at a high (H) level for two consecutive cycles and when /CS=/RAS=/CAS=L (low level) and /WE=H. Further, when /CS=/RAS /CAS=L and /WE=H at the time of a change of the clock enable signal CKE from H to L, the self-refresh mode can be entered. In the SDRAM device which is in the self-refresh mode, it is possible to stop the control thereof from an external device at any time by input a command synchronized with the clock signal. The command is interpreted by a command decoder built in the DRAM device.

However, the entry of the self-refresh mode in the SDRAM devices has the following disadvantages.

Generally, a system such as a computer, or a peripheral device uses a group of SDRAM devices. Such a group is called a chip set. Each of the DRAMs in the chip set requires the respective chip select signal /CS, low address strobe signal /RAS, column address strobe signal /CAS and write enable signal /WE. That is, these signals are respectively generated for each of the SDRAM devices in the chip set. On the other hand, the clock enable signal CKE used to determine whether the synchronizing clock signal CLK should be received is used common to the SDRAM devices of the chip set. Hence, the clock enable signal CKE has a very heavy load, as compared with the signals /CS, /RAS, /CAS and /WE. The difference between the load burdened by the clock enable signal CKE and the loads burdened by the other signals causes a timing error between the signals. More particularly, a change of the clock enable signal CKE lags behind the changes of the other signals. The timing error affects the command entry operation, particularly entry of the self-refresh mode.

The above timing error makes it impossible to detect the command for entry of the self-refresh mode of the SDRAM device (detect the situation in which /CS=/RAS=/CAS=L and /WE=H at the time when the clock enable signal CKE changes from H to L). In other words, the command entry of the self-refresh mode in the SDRAM device is defined, but cannot be substantially carried out under the situation in which a plurality of SDRAM devices are grouped as a chip set.

SUMMARY OF THE INVENTION

It is a general object of the present invention to provide a semiconductor memory device in which the above disadvantages are eliminated.

A more specific object of the present invention is to provide a semiconductor memory device in which entry of the self-refresh mode can be certainly carried out.

The above objects of the present invention are achieved by a semiconductor memory device operable in synchronism with a clock signal externally supplied thereto, the semiconductor memory device comprising: a first part which detects a state of a predetermined signal after a given command is input to the semiconductor memory; and a second part which sets, on the basis of the state of the predetermined signal, the semiconductor memory device to a self-refresh mode in which a refresh operation is carried out without an external signal.

The semiconductor memory device may be configured so that: the predetermined signal is a clock enable signal which indicates whether the clock signal should be received by the semiconductor memory device; and the second part sets the semiconductor memory device to the self-refresh mode when the clock enable signal has a predetermined state change after the given command is input to the semiconductor memory device.

The semiconductor memory device may be configured so that: the predetermined signal is a signal which cancels entry of the self-refresh mode; and the second part sets the semiconductor memory device to the self-refresh mode when there is no signal which cancels entry of the self-refresh mode during a given period after the given command is input to the semiconductor memory device.

The semiconductor memory device may be configured so that: the predetermined signal corresponds to the clock signal; and the second part sets the semiconductor memory device to the self-refresh mode when the clock signal is fixed to a predetermined level during a given period after the given command is input to the semiconductor memory device.

The semiconductor memory device may be configured so that the given period starts from a time at which the given command is input to the semiconductor memory device.

The semiconductor memory device may be configured so that the given period starts from a time at which the predetermined state change of the clock enable signal occurs.

The semiconductor memory device may be configured so that the given period starts from a time at which the clock signal is fixed to the predetermined level after the given command is input to the semiconductor memory device.

The semiconductor memory device may be configured so that the given command is a command which requests for entry of an auto-refresh mode in which the refresh operation is carried out with an external signal.

The semiconductor memory device may be configured so that it further comprises a third part which disables, when the self-refresh mode is set, a circuit which receives signals externally supplied to the semiconductor memory device and other than the clock signal and clock enable signal.

The semiconductor memory device may be configured so that the second part releases the semiconductor memory device from the self-refresh mode in response to a command which requests a release of the self-refresh mode.

BRIEF DESCRIPTION OF THE DRAWINGS

Other objects, features and advantages of the present invention will become more apparent from the following detained description when read in conjunction with the accompanying drawings, in which:

FIG. 2A is a diagram showing an operation of a command decoder shown in FIG. 1;

FIG. 2B is a diagram showing an operation of an I/O data buffer/register shown in FIG. 1;

FIG. 16 is a timing chart of an operation of the self-refresh controller shown in FIG. 15.

DESCRIPTION OF THE PREFERRED EMBODIMENTS

Figure 1:
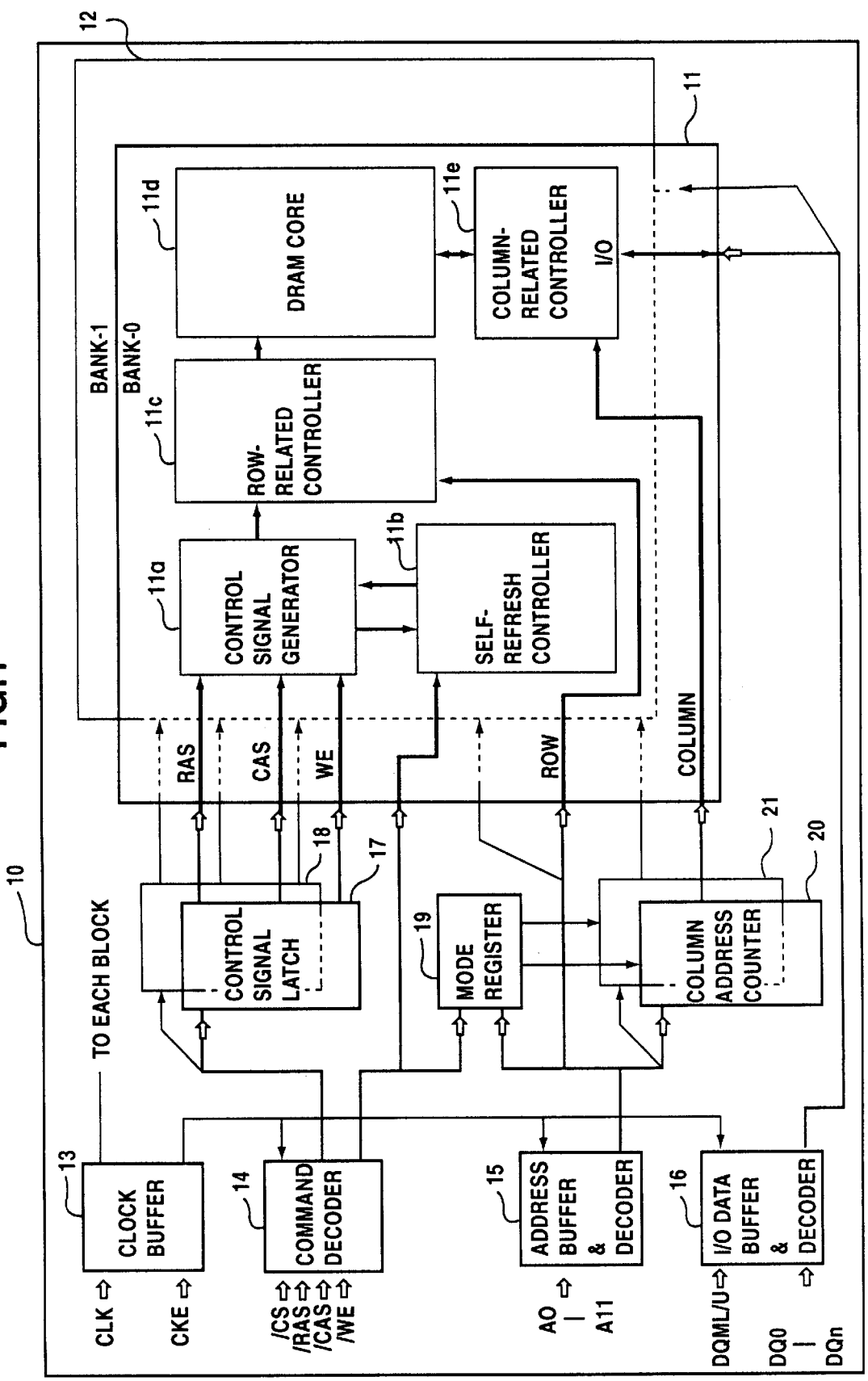
FIG. 1 is a block diagram of a semiconductor memory device according to an embodiment of the present invention.

FIG. 1 is a block diagram of an SDRAM device 10 according to an embodiment of the present invention. The SDRAM device 10 includes a plurality of banks 11 (BANK-0) and 12 (BANK-1). Although only two banks 11 and 12 are shown in FIG. 1, the SDRAM device can include three banks or more in practical use. In the following explanation, the SDRAM device 10 is handled so that it has only two banks 11 and 12.

Each of the banks 11 and 12 has an identical structure. FIG. 1 shows the detail of the bank 11. The bank 11 has a control signal generator 11a for internal circuits, a self-refresh controller 11b, a row-related controller 11c, a DRAM core 11d and a column-related controller 11e. The above parts of the bank 11 will be described in detail later.

Further, the SDRAM device 10 includes a clock buffer 13, a command decoder 14, an address buffer and decoder 15, an I/O data buffer and decoder 16, control signal latch circuits 17 and 18, a mode register 19 and column address counters 20 and 21.

The clock buffer 13 receives the clock signal CLK externally supplied for synchronization and the clock enable signal CKE indicating whether the clock signal CLK should be taken in the SDRAM device 10. When the clock enable signal CKE is ON, the clock signal CLK is supplied to each of the blocks of the SDRAM device 10. Further, the clock enable signal CKE is read from the clock buffer 13, and is supplied to the blocks 14, 15 and 16.

The command decoder 14 decodes the chip select signal /CS, the row address strobe signal /RAS, the column address strobe signal /CAS and the write enable signal /WE, and generates various control signals therefrom. The control signals are then applied to the control signal latch circuits 17, 18, and the mode register 19.

FIG. 2A shows an operation of the command decoder 14. A command which requests entry of the auto-refresh mode is defined by the following:

1) The clock enable signal CKE is continuously high (H) during cycles (n-1) and n;

2) /CS=/RAS=/CAS=L (low); and

3) /WE=H.

A command which requests entry of the self-refresh mode is defined by the following:

1) The clock enable signal CKE is H during the cycle (n-1) and is changed to be low during the next cycle n;

2) /CS=/RAS=/CAS=L (low); and

3) /WE=H.

As will be described in detail later, the command decoder 14 operates in a specific fashion directed to entry and release of the self-refresh mode.

The address buffer and decoder 15 latches an address signal comprised of address bits A0–A11, and decodes it. The decoded address signals thus generated are supplied to the mode register 19, the banks 11 and 12 and the column address counters 20 and 21.

The I/O data buffer and decoder 16 controls inputting and outputting of data, and operates as shown in FIG. 2B. For example, if a data control signal DQML is low and the clock enable signal CKE is high during the cycle (n-1), the write/output operation on only the lower bytes of data DQ0–DQ3 are enabled.

The control signal latch circuits 17 and 18 receive the signals /RAS, /CAS and /WE from the command decoder 14, and sends them to the banks 11 and 12.

The mode register 19 receives the given decoded command and the decoded address signal, and sets and resets a given operation mode, such as a burst mode. In the burst mode, a given number of data bits is stored and is then written into selected memory cells. In order to realize the burst mode, the mode register 19 controls the count operation of the column address counters 20 and 21. The column address counters 20 and 21 count the decoded address signal and thus generates a column address. When the burst mode is specified by the mode register 19, the column address counters 20 and 21 change the count operations so that the column address is intermittently output.

As has been described previously, the bank 11 has the control signal generator 11a for internal circuits, the self-refresh controller 11b, the row-related controller 11c, the DRAM core 11d and the column-related controller 11e.

The DRAM core lid includes an array of memory cells arranged in a matrix formation, sense amplifiers, word decoders and column decoders. Each of the memory cells is made up of one transistor and one capacitor. The sense amplifiers are coupled to respective pairs of bit lines connected to the memory cells. The word decoders drive word lines connected to the memory cells. The column decoders drive columns of memory cells and couple the bit lines to corresponding data bus lines.

The control signal generating circuit 11a generates, from the signals RAS, CAS and WE, various control signals to be applied to the row-related controller 11c. Further, the control signal generating circuit 11a is controlled by the self-refresh controller 11b so that the control signal necessary for the word decoder driver provided in the row-related controller 11c is generated when entry of the self-refresh command is detected by the self-refresh controller 11b. This will be described in more detail later.

The self-refresh controller 11b detects entry of the self-refresh mode as will be described later, and controls the control signal generating circuit 11a so that the SDRAM device 10 operates in the self-refresh mode. The detail of the self-refresh controller 11b will be described in detail later.

The row-related controller 11c includes a predecoder, a word decoder driver and a sense amplifier driver. The predecoder of the circuit 11c receives the row address supplied from the address buffer and decoder 15 and the corresponding control signal supplied from the control signal generating circuit 11a, and generates a predecoded row address signal. The predecoded row address signal is supplied to the word decoder of the DRAM core lid. The word decoder driver drives the word decoder provided in the DRAM core 11d in accordance with the corresponding control signal supplied from the control signal generating circuit 11a. The sense amplifier driver of the row-related controller 11c drives the sense amplifiers provided in the DRAM core 11d in accordance with the corresponding control signal supplied from the control signal generating circuit 11a.

The column-related controller 11e includes a predecoder which generates, from the column address generated by the column address counter 20, a predecoded column address signal for the column decoder provided in the DRAM core 11d, and an I/O data selector. The predecoded column address signal is applied to the column decoder provided in the DRAM core 11d. The I/O data selector provided in the column-related controller 11e selects read data to be output to the I/O data buffer and decoder 16 and selects write data to be written into the selected memory cells in accordance with the column address.

The entry of the self-refresh mode in the SDRAM device 10 can be realized as follows.

Figure 3:
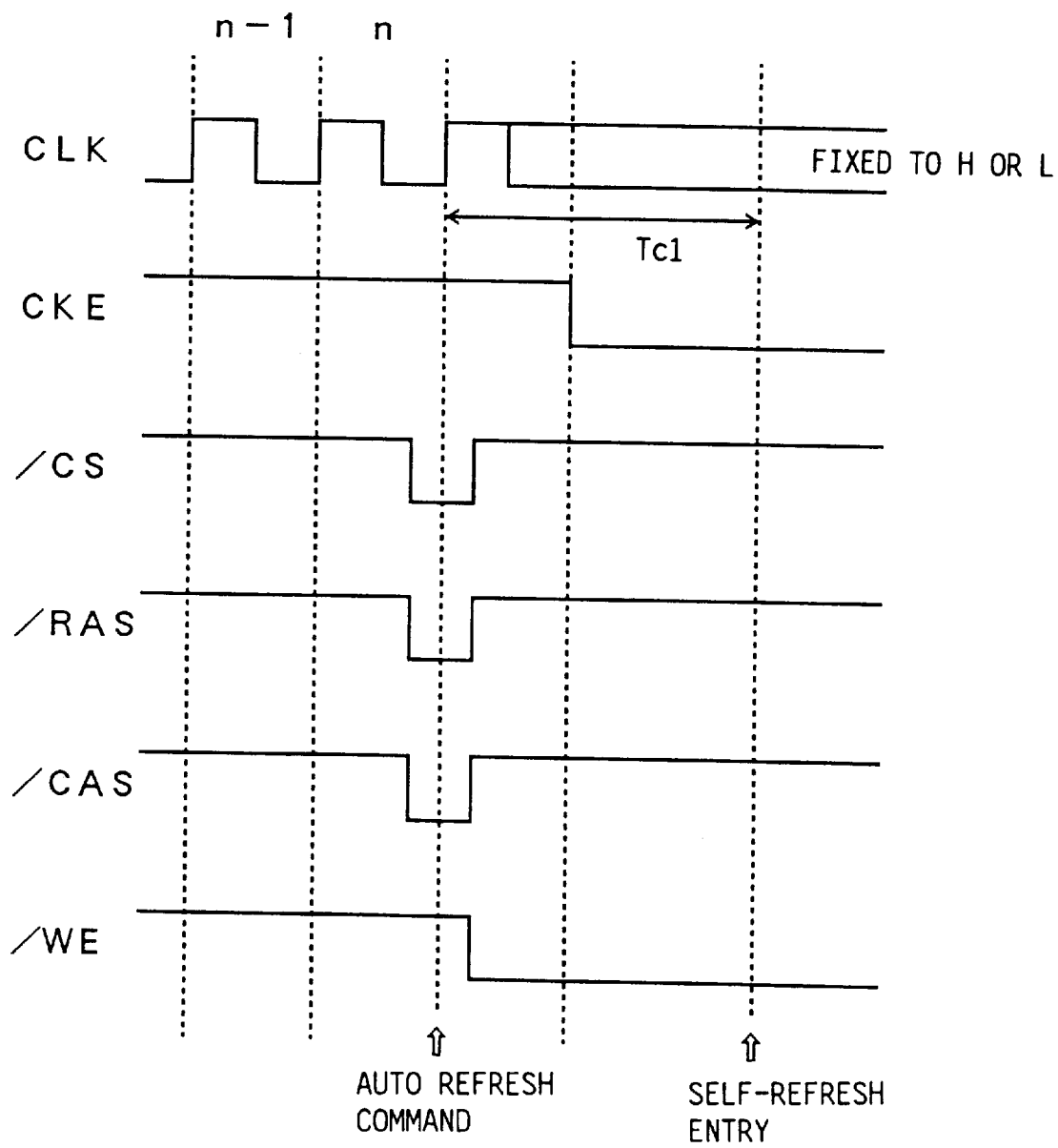
FIG. 3 is a timing chart of a first operation of the semiconductor device shown in FIG. 1.

FIG. 3 is a timing chart of a first operation of the command decoder 14 shown in FIG. 1. As shown in FIG. 2A, the entry of the self-refresh mode can be requested when $CKE_{n-1}$=H, $CKE_n$=L, /CS =/RAS=/CAS=L and /WE=H. Originally, the clock enable signal CKE must be changed to the low level during the cycle n. However, the clock enable signal CKE is required to drive a large load and is maintained at the high level during the cycle n. That is, the entry of the auto-refresh mode is requested during the cycle n. When the request for entry of the auto-refresh mode is detected by the command decoder 14, the command decoder 14 starts to measure a given constant time $T_{c1}$ (equal to, for example, 100 μs), as will be described later.

If the command decoder 14 detects a H-to-L change of the clock enable signal CKE during the given constant time $T_{c1}$, the self-refresh controller 11b is informed of the detection of the H-to-L change of the clock enable signal CKE. In this case, the self-refresh controller 11b recognizes that entry of the self-refresh mode is requested if the clock enable signal CKE is changed to the low level during the given constant period $T_{c1}$ even if the above change of the clock enable signal CKE occurs independently of the other signals.

If a cancel command is decoded by the command decoder 14 during the constant period $T_{c1}$, the request for entry of the self-refresh mode is not accepted, as will be described later.

As described above, a request for entry of the self-refresh mode can be certainly detected if the H-to-L change of the clock enable signal CKE is detected during the constant period $T_{c1}$ after the auto-refresh mode is detected. The constant period $T_{c1}$ can be arbitrarily selected. However, it is preferable that the constant period $T_{c1}$ ensures entry of the self-refresh mode and is as short as possible.

Figure 4:
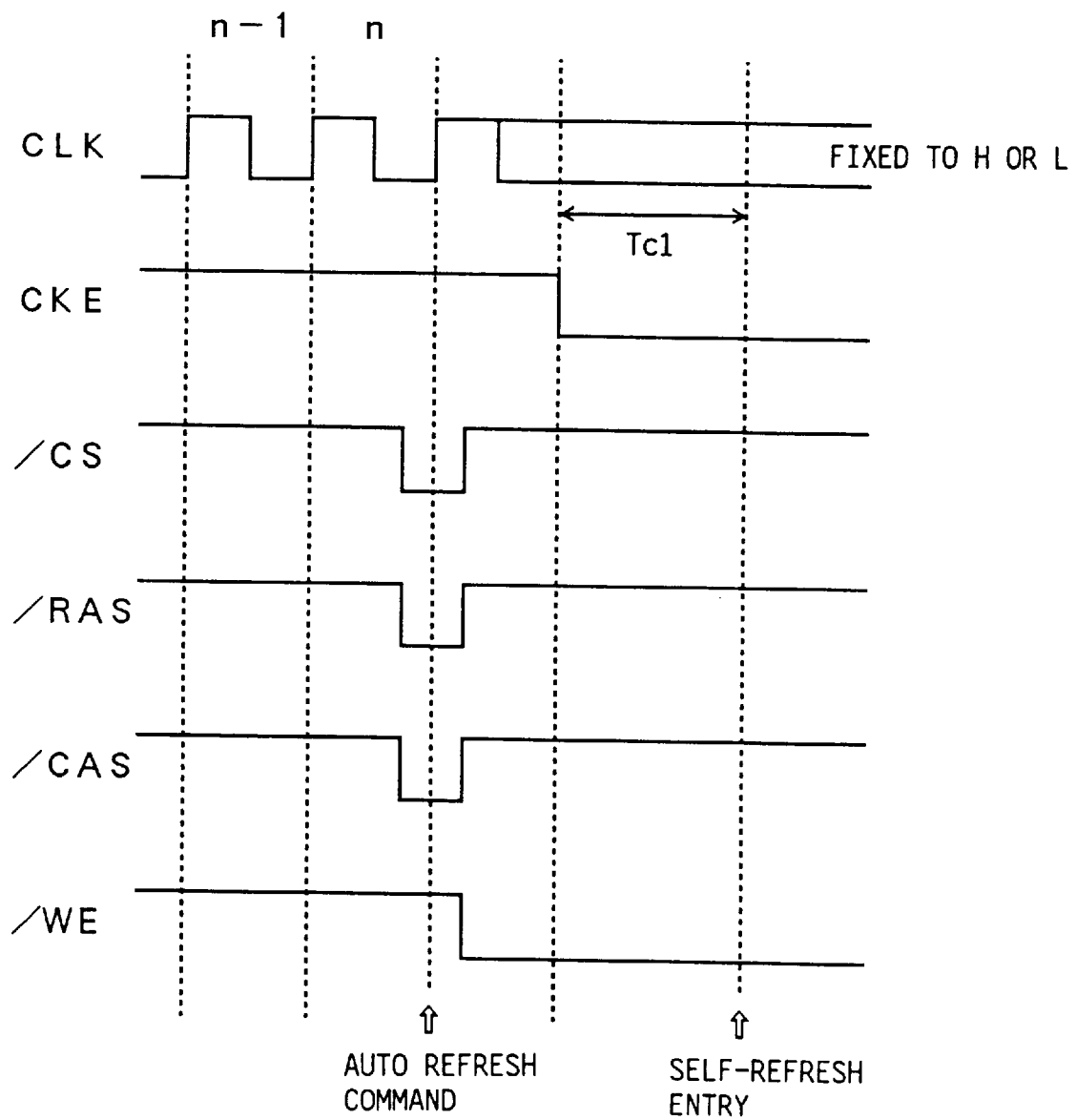
FIG. 4 is a timing chart of a second operation of the semiconductor device shown in FIG. 1.

FIG. 4 is a timing chart of a second operation of the command decoder 14. The command decoder 14 detects a request for entry of the auto-refresh mode, as in the case shown in FIG. 3. However, the starting time of the constant period $T_{c1}$ shown in FIG. 4 differs from that shown in FIG. 3. More particularly, the constant period $T_{c1}$ is started to be measured when the clock enable signal CKE is switched to the low level. If the command decoder 14 detects an event in which the clock enable signal CKE is maintained at the low level during the constant period $T_{c1}$ (equal to, for example, 100 μs), the command decoder 14 informs the self-refresh controller 11b of the above event. Then, the self-refresh controller 11b recognizes the request for entry of the self-refresh mode. The constant period $T_{c1}$ functions to discriminate the entry of the self-refresh command from a command which is in a standby state. If the cancel command is decoded by the command decoder 14 during the constant period $T_{c1}$, the request for entry of the self-refresh mode is not accepted. The second operation shown in FIG. 4 has the same advantages as those of the first operation shown in FIG. 3.

Figure 5:
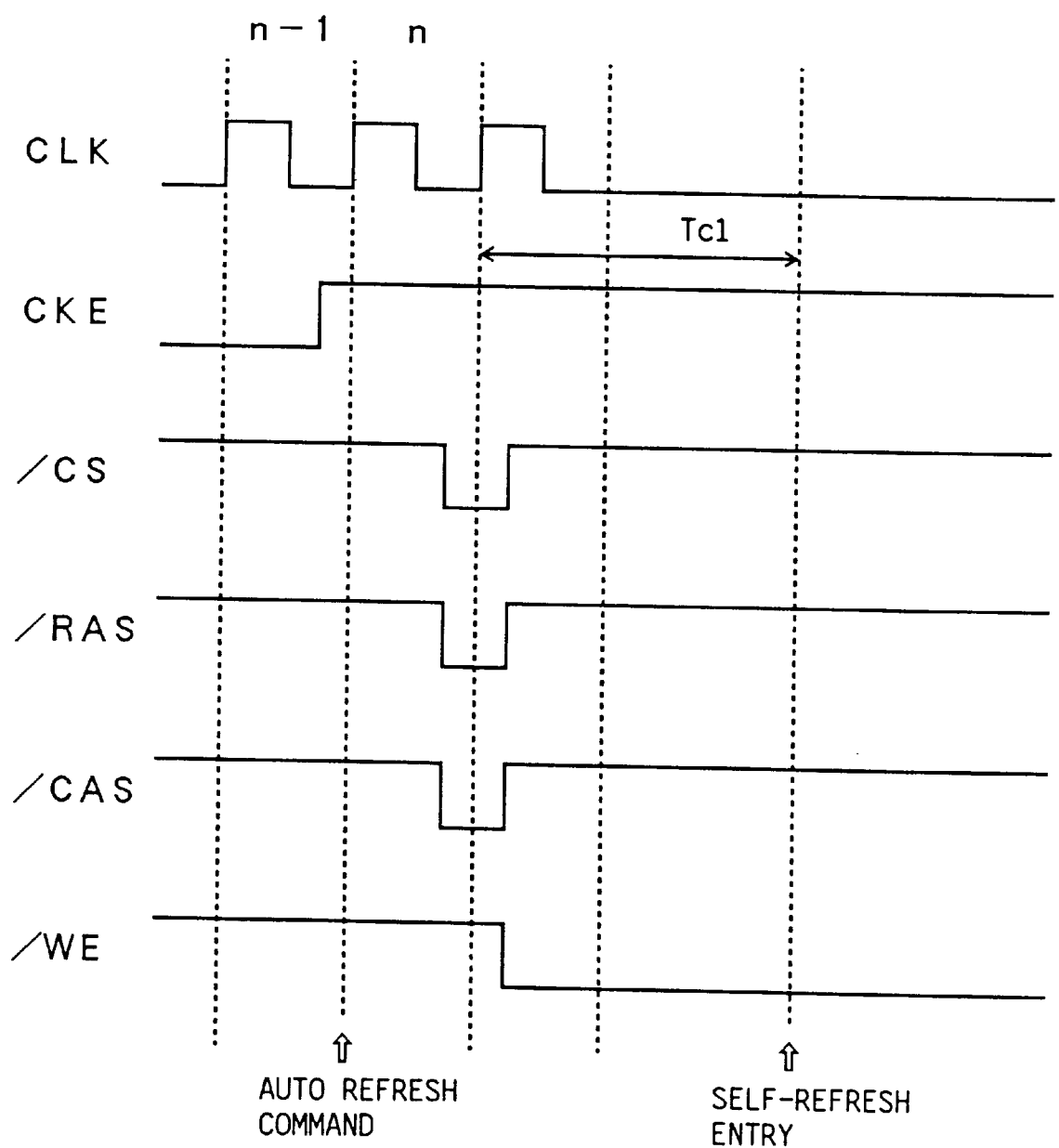
FIG. 5 is a timing chart of a third operation of the semiconductor device shown in FIG. 1.

FIG. 5 is a timing chart of a third operation of the command decoder 14. In FIG. 5, the clock enable signal CKE is changed to the high level at the end of the cycle (n-1). This means that a command is input which requests for entry of the auto-refresh mode without using the clock enable signal CKE. The constant period $T_{c1}$ (equal to, for example, 100 μs) is started to be measured when the request for entry of the auto-refresh mode is detected. If the clock signal CLK is fixed to the high level or the low level during the constant period $T_{c1}$ (fixed to the low level in the case shown in FIG. 5), the request for entry of the self-refresh mode is detected or recognized. If the cancel command is decoded by the command decoder 14 during the constant period $T_{c1}$, the request for entry of the self-refresh mode is not accepted. The third operation shown in FIG. 5 has the same advantages as those of the first operation shown in FIG. 3.

Figure 6:
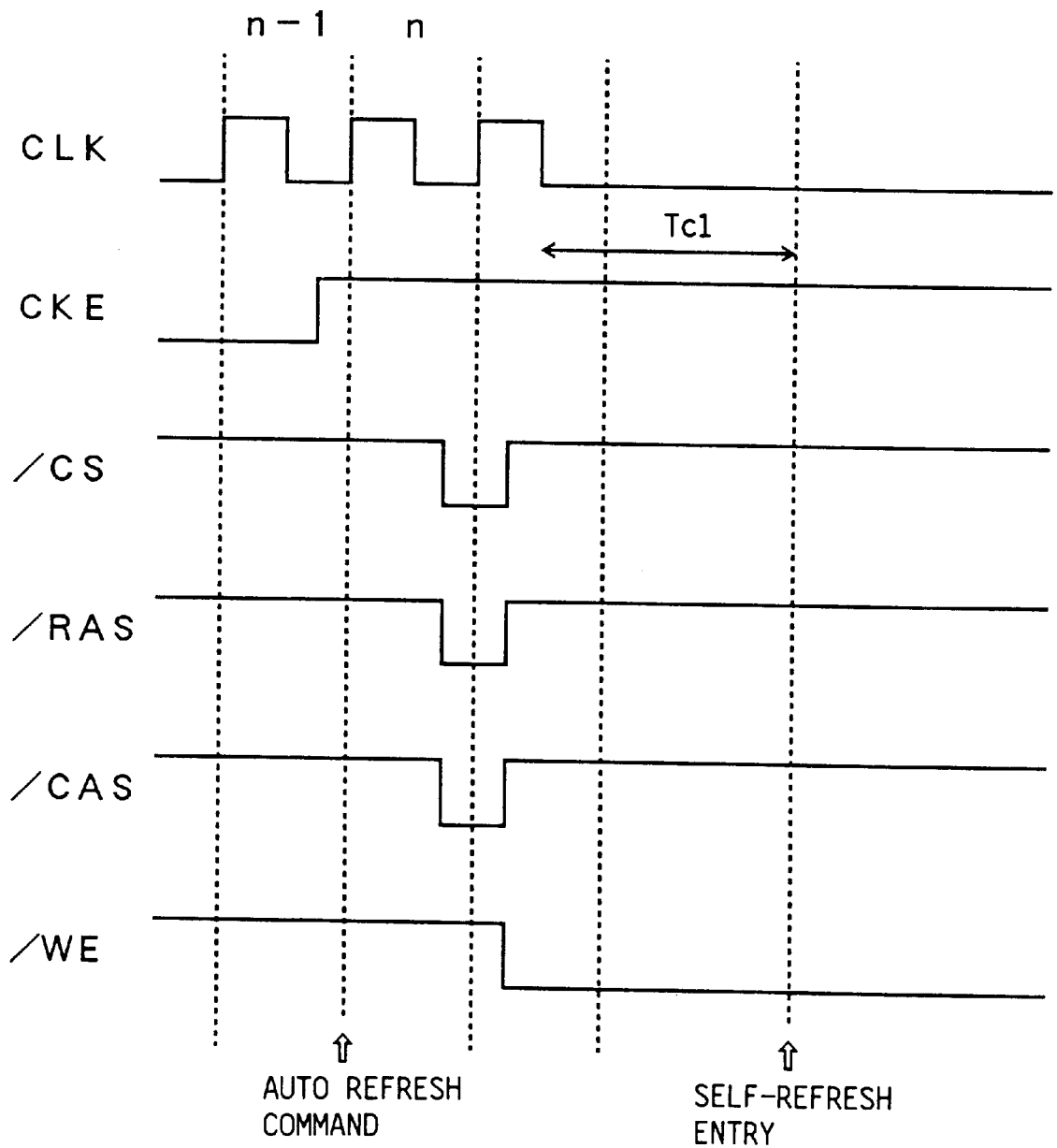
FIG. 6 is a timing chart of a fourth operation of the semiconductor device shown in FIG. 1.

FIG. 6 is a timing chart of a fourth operation of the command decoder 14. As in the case shown in FIG. 5, the request for entry of the auto-refresh mode is accepted once. However, the fourth operation shown in FIG. 6 differs from the third operation shown in FIG. 5 in which the constant period $T_{c1}$ (equal to, for example, 100 μs) is started to be measured when the clock signal CLK is switched to the low level after entry of the auto-refresh mode. If the clock signal CLK is fixed to the high or low level (low level in the case shown in FIG. 6) during the constant period $T_{c1}$, it is recognized that the entry of the self-refresh mode is requested. If the cancel command is decoded by the command decoder 14 during the constant period $T_{c1}$, the request for entry of the self-refresh mode is not accepted. The fourth operation shown in FIG. 6 has the same advantages as those of the first operation shown in FIG. 3.

In the first through fourth operations, there may be a situation in which no signal is externally applied to the SDRAM device when the SDRAM device is in the self-refresh mode. In order to release the SDRAM device from the self-refresh mode, it is necessary to externally supply the SDRAM device with some signals which request releasing the SDRAM device from the self-refresh mode. Generally, a circuit which accepts the above signals consumes a relatively large amount of energy. With the above in mind, the clock signal CLK and the clock enable signal CKE are used to request releasing the SDRAM device from the self-refresh mode. In this case, the clock buffer 13 is maintained in the active state, while the remaining circuits are maintained in the disabled state. Hence, it is possible to reduce energy consumed in the SDRAM device.

A description will now be given of operations directed to releasing the SDRAM device from the self-refresh mode.

Figure 7:
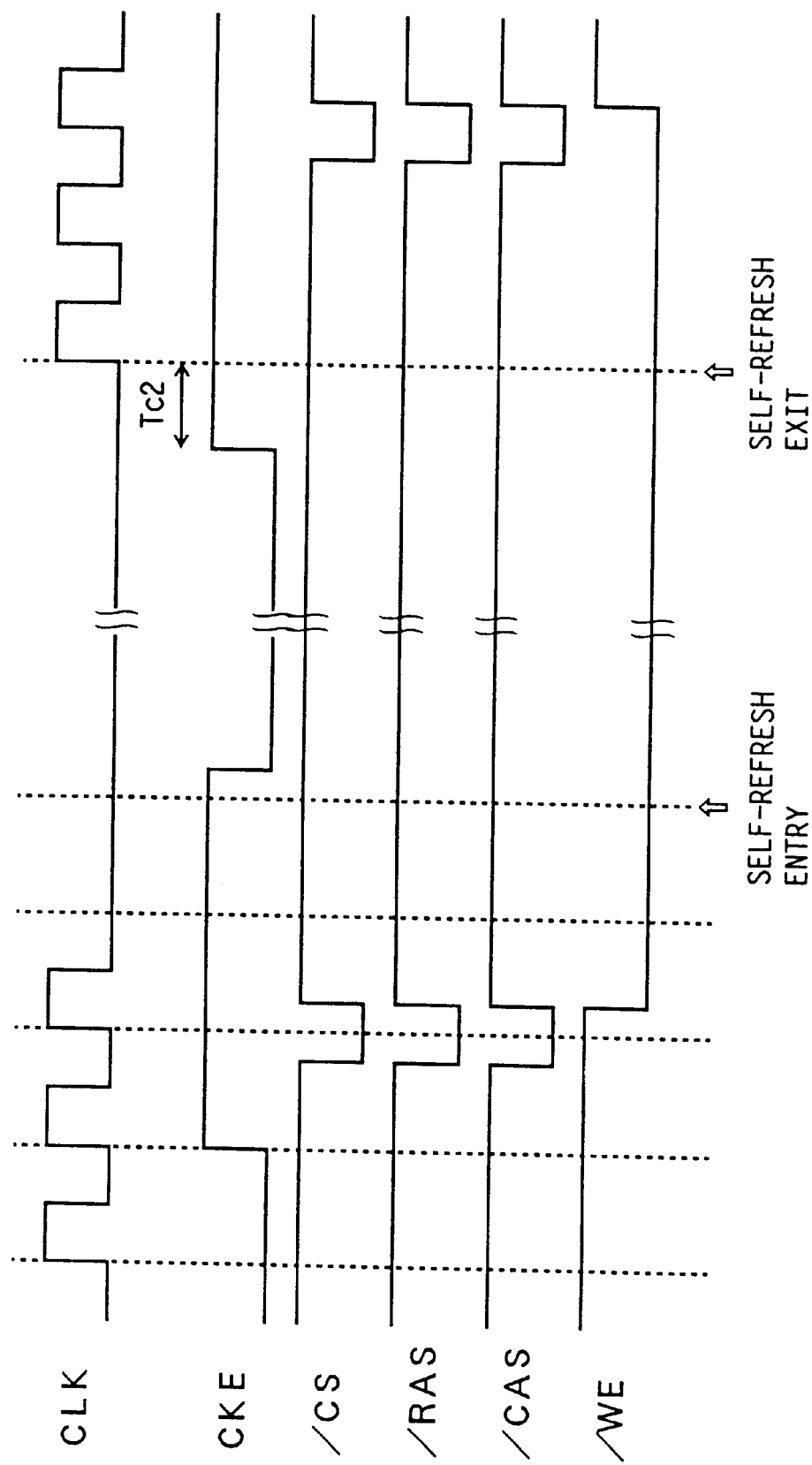
FIG. 7 is a timing chart of a fifth operation of the semiconductor device shown in FIG. 1.

FIG. 7 is a timing chart of a fifth operation of the command decoder 14. In FIG. 7, a request for entry of the self-refresh mode is carried out in the third or fourth operation shown in FIG. 5 or FIG. 6, in which it is checked whether the clock signal CLK is changed during the given period $T_{c1}$. In order to release the SDRAM device from the self-refresh mode, the clock enable signal CKE is set to the high level a given constant period $T_{c2}$ prior to the time at which the SDRAM device is released from the self-refresh mode. Hence, the clock signal CLK can be accepted. In this state (in which the clock enable signal CKE is high), a supply of the clock signal CLK is started, and a self-refresh exit command is defined. Hence, the SDRAM device can be released from the self-refresh mode.

When the entry of the self-refresh mode is carried out by using the clock enable signal CKE (the clock signal CLK is continuously supplied while the clock enable signal CKE is low as shown in FIG. 3 or FIG. 4), the SDRAM device can be released from the self-refresh mode when the clock enable signal CKE is switched to the high level. When the entry of the self-refresh mode is carried out by detecting a stop of supply of the clock signal CLK while the clock enable signal CKE is fixed to the high level, the SDRAM can be released from the self-refresh mode by restarting a supply of the clock signal CLK. It is preferable that a given fixed period is defined as a margin period enabling a smooth change from the self-refresh mode to the normal mode.

In the above fifth operation, the SDRAM device is switched to the self-refresh mode, and is then released therefrom. Alternatively, it is advantageous to cancel the request for entry of the self-refresh mode by using the aforementioned cancel signal before the SDRAM device is switched to the self-refresh mode. The above advantage will satisfy some needs of users. The above alternative operation will be described below as a sixth operation with reference to FIG. 8.

As has been described with reference to FIG. 3, the request for entry of the self-refresh mode is accepted when the clock enable signal CKE is switched to the low level in the given constant period $T_{c1}$ after the request for entry of the auto-refresh mode is accepted. With the above in mind, the request for entry of the self-refresh mode can be canceled by switching the clock enable signal CKE to the high level at the time which leads by a time A to the timing at which the request should be canceled. When the enable clock signal CKE is switched to the high level, a command can be accepted by the command decoder 14. Hence, the request for entry of the self-refresh mode can be canceled by applying a new command other than the defined commands to the command decoder 14. In the case shown in FIG. 8, the above newly defined command is applied when /CS=/RAS=/CAS=/WE=L. The command decoder 14 decodes the newly defined command, and cancels the request for entry of the self-refresh mode and the parts of the SDRAM device.

When the entry of the self-refresh mode is requested by fixing the clock signal CLK to the high or low level while the clock enable signal CKE is fixed to the high level (as in the cases shown in FIGS. 5 and 6), the request for entry of the self-refresh mode can be canceled by restarting supply of the clock signal CLK. In this case, no newly defined command as described above is required.

Figure 8:
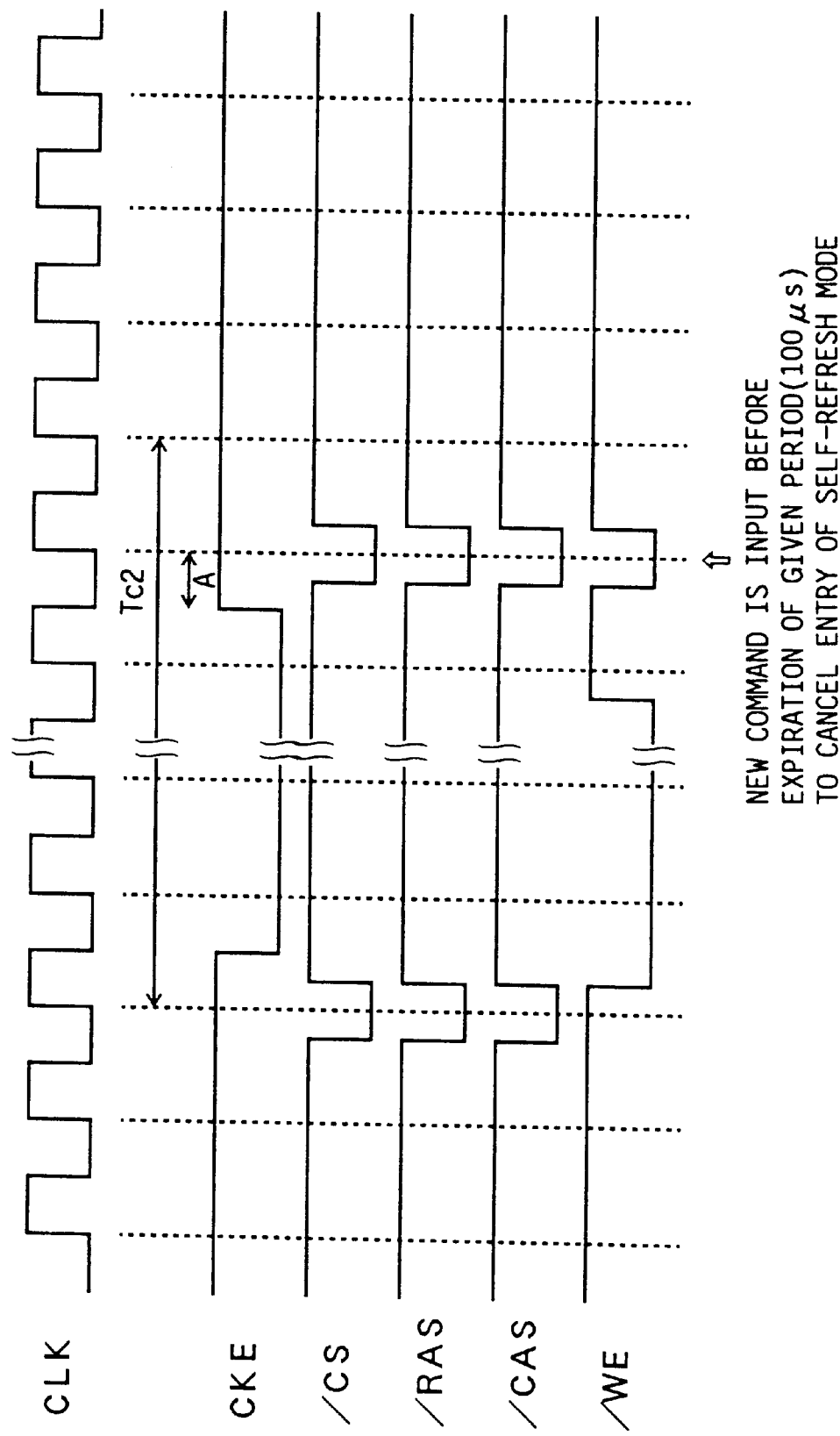
FIG. 8 is a timing chart of a sixth operation of the semiconductor device shown in FIG. 1.

When the entry of the self-refresh mode is requested by fixing the clock signal CLK to the high or low level and switching the clock enable signal CKE to the low level at an arbitrary time, the request for entry of the self-refresh mode can be canceled by supplying the clock signal CLK during two cycles before the time at which the request should be canceled and switching the clock enable signal CKE to the high level before the beginning of the period A shown in FIG. 8. In this case, no newly defined command is required.

Figure 9:
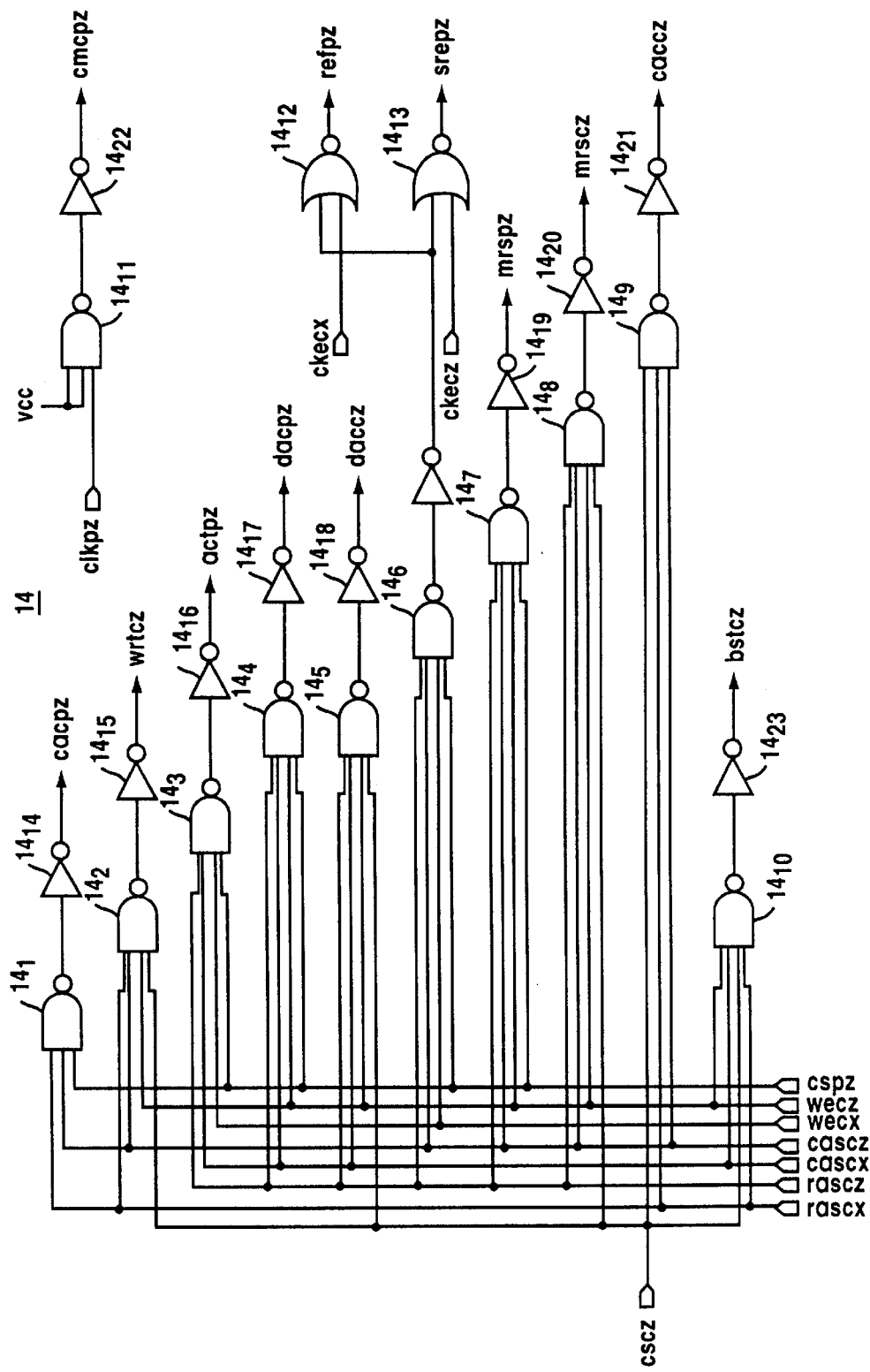
FIG. 9 is a circuit diagram of the command decoder shown in FIG. 1.

FIG. 9 is a circuit diagram of the command decoder 14 shown in FIG. 1. The command decoder 14 receives signals rascx, rascz, cascx, cascz, wecx, wecz, and cspz, and generates various decoded signals. The signals rascx, cascx and wecx correspond to the aforementioned signals /RAS, /CAS and /WE, respectively. The signals rascz, cascz, wecz and cspz correspond to inverted versions of /RAS, /CAS, /WE and /CS. Further, the command decoder 14 receives a signal clkpz which is the inverted version of the clock signal CLK, and signals ckecx and ckez which correspond to the clock enable signal CKE and its inverted version.

The command decoder 14 includes NAND gates $14_1$–$14_{11}$, NOR gates $14_{12}$ and $14_{13}$, and inverters $14_{14}$–$14_{23}$. The above input signals are decoded by these logic elements, which result in decoded signals. For example, the auto-refresh command is detected by the NAND gate $14_6$ and the NOR gate $14_{12}$, and a decoded signal refpz is output from the NOR gate $14_{12}$. That is, the NAND gate $14_6$ and the NOR gate $14_{12}$ performs the logic operation relating to the auto-refresh command shown in FIG. 2A. The self-refresh command is detected by the NAND gate $14_6$ and the NOR gate $14_{13}$, and a decoded signal srepz is output from the NOR gate $14_{13}$. That is, the NAND gate $14_6$ and the NOR gate $14_{13}$ performs the logic operation relating to the self-refresh command shown in FIG. 2A. It should be noted that the present invention makes it possible to enable entry of the self-refresh mode by the aforementioned operations even if the decoded signal srepz is not generated. The above decoded signals refpz and srepz are applied to the self-refresh controller 11b shown in FIG. 1.

A decoded signal wrtcz, which is output from the inverter $14_{15}$, activates circuits relating to generation of the row address and the auto-refresh mode. A decoded signal cacpz, which is output from the inverter $14_{14}$, activates circuits relating to generation of the row address and the self-refresh mode. A decoded signal actpz, which is output from the inverter $14_{16}$, activates circuits relating to generation of the row address and the active mode shown in FIG. 2A. A decoded signal dacpz, which is output from the inverter $14_{17}$, activates circuits relating to the precharge operation. The above commands cacpz, actpz and dacpz are applied to the self-refresh controller 11b shown in FIG. 1.

A decoded signal mrspz, which is output from the inverter $14_{19}$, indicates set of a given mode such as the aforementioned burst mode. A decoded signal mrscz, which is output from the inverter $14_{20}$, indicates reset of the given mode. The decoded signal mrspz is applied to the self-refresh controller 11b and the mode register 19. The decoded signal mrscz is applied to the mode register 19. A decoded signal bstcz, which is output from the inverter $14_{23}$, indicates the burst mode, and is supplied to the control signal latch circuits 17 and 18 and the self-refresh controller 11b. A decoded signal caccz, which is output from the inverter $14_{21}$, indicates cancellation of the column address strobe signal /CAS, and is supplied to the control signal latch circuits 17 and 18 and the self-refresh controller 11b.

A signal clkpz, which corresponds to the clock signal CLK, is converted into an internal clock signal cmcpz by the NAND gate $14_{11}$ and the inverter $14_{22}$.

Figure 10:
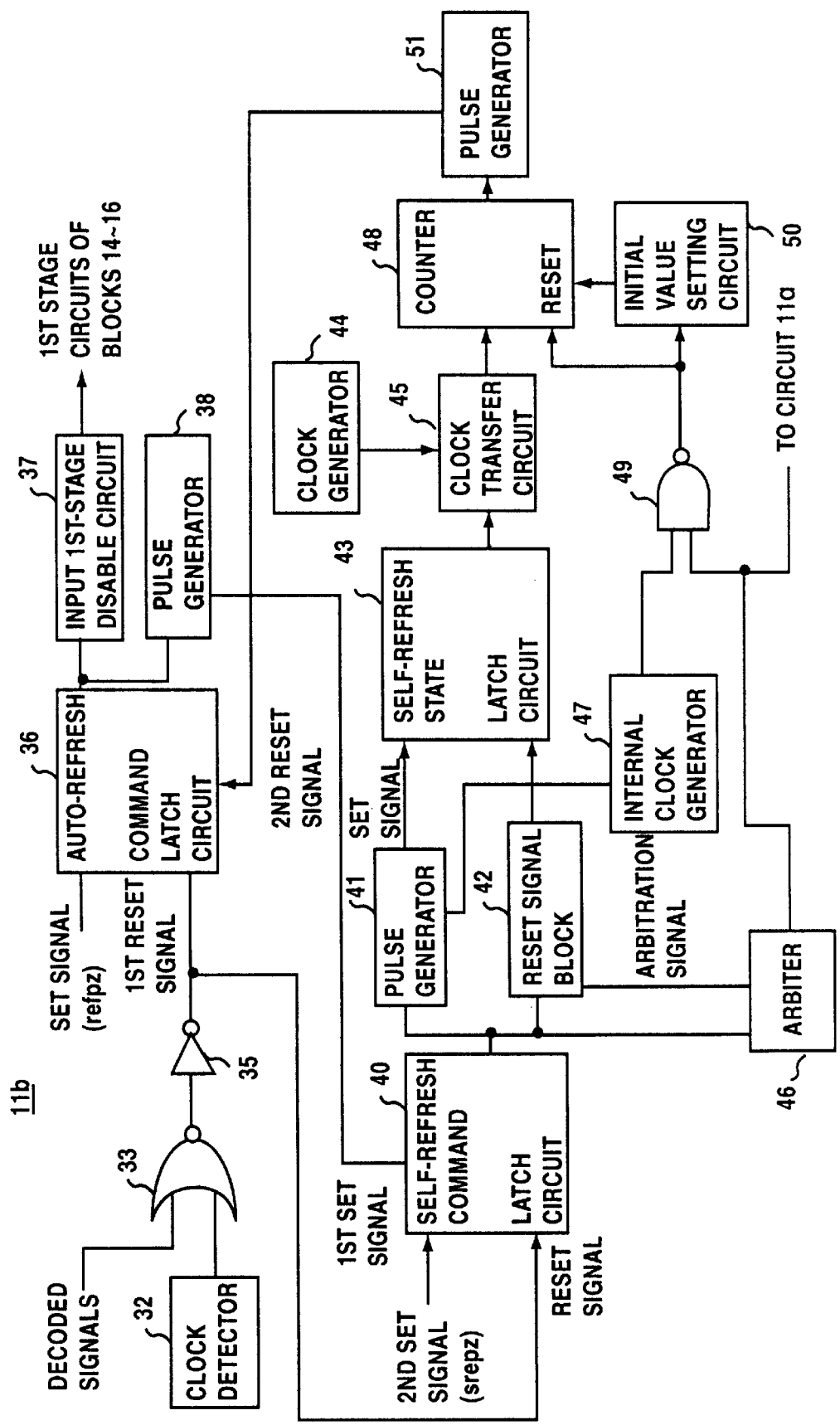
FIG. 10 is a block diagram of a self-refresh controller shown in FIG. 1.

FIG. 10 is a block diagram of the self-refresh controller 11b shown in FIG. 1. The structure shown in FIG. 10 corresponds to the operations, in which the beginning of the constant period $T_{c1}$ depends on the clock signal CLK. An auto-refresh command latch circuit 36 receives a set signal, which corresponds to the above-mentioned decoded signal refpz, and outputs a resultant latch signal. A one-shot-pulse generator 38 converts the set signal into a pulse signal, which is applied, as a first set signal, to a self-refresh command latch circuit 40. In response to the first set signal, the self-refresh command latch circuit 40 is set. The self-refresh command latch circuit 40 can also be set in response to a second set signal, which corresponds to the aforementioned decoded signal srepz. The second set signal is used to accept a request for entry of the self-refresh mode as defined in FIG. 2A. The first set signal supplied from the auto-refresh command latch circuit 36 via the one-shot-pulse generator 38 is defined according to the present invention.

When the self-refresh command latch circuit 40 is set, it outputs a latch signal, which is converted into a pulse signal by a one-shot-pulse generator 41. The above pulse signal is applied, as a set signal, to a self-refresh state latch circuit 43. When the self-refresh state latch circuit 43 is set, it activates a clock transfer circuit 45, which allows a clock signal generated by a clock generator 44 formed of, for example, a ring oscillator, to applied to a counter 48. The counter 48, which is reset by an output signal of a NAND gate 49, counts the clock signal received from the clock generator 44 via the clock transfer circuit 45, and generates an output signal when the count value becomes equal to a given number corresponding to the given constant period $T_{c1}$ (equal to, for example, 100 μs). A one-shot-pulse generator 51 converts the output signal of the counter 48 into a pulse signal, which is applied, as a second reset signal, to the auto-refresh command latch circuit 36. The above pulse circuit is also applied to an arbiter 46.

In response to the second reset signal, the auto-refresh command latch circuit 36 is reset, and the arbiter 46 sends a pulse signal to the control signal generating circuit 11a shown in FIG. 1, so that the circuit 11a is driven at the timing specified by the pulse signal from the arbiter 46. The arbiter 46 sends an arbitration signal having a given pulse duration to a reset signal block circuit 42. When the self-refresh command latch circuit 40 is reset, the resultant output signal thereof is allowed to pass through the reset signal block circuit 42, and is applied to the self-refresh state latch circuit 43, if the arbitration signal is not applied to the reset signal block circuit 42. If the arbitration signal is applied to the reset signal block circuit 42, it blocks the output signal of the latch circuit 40 for the period corresponding to the given pulse duration. The arbitration signal is used taking into a situation in which the DRAM core lid is being accessed and cannot be released from the self-refresh mode immediately. In this case, the DRAM core 11d is not immediately released from the self-refresh mode and is released after the given period.

An input first-stage disable circuit 37, which is connected to input first-stage circuits of the blocks 14, 15 and 16, disables the input first-stage circuits in response to the latch signal of the auto-refresh command latch circuit 36. Hence, it is possible to reduce energy consumed in the blocks 14, 15 and 16.

The auto-refresh command latch circuit 36 can also be reset by a first reset signal, which is generated by a clock detector 32, a NOR gate 33 and an inverter 35. The NOR gate 33 receives a decoded signal which corresponds to the aforementioned newly defined command and indicates cancellation of entry of the self-refresh mode. The clock detector 32 corresponds to the aforementioned fifth and sixth operation shown in FIGS. 7 and 8. That is, the clock detector 32 detects the first appearance of the pulse of the clock signal CLK after the clock enable signal CKE is switched to the high (enable) level. The output signal of the NOR gate 33 is inverted by the inverter 35, which applies, as the first reset signal, the inverted version thereof to the auto-refresh command latch circuit 36. The first reset signal is also applied to the self-refresh command latch circuit 40 in order to reset it.

Figure 11:
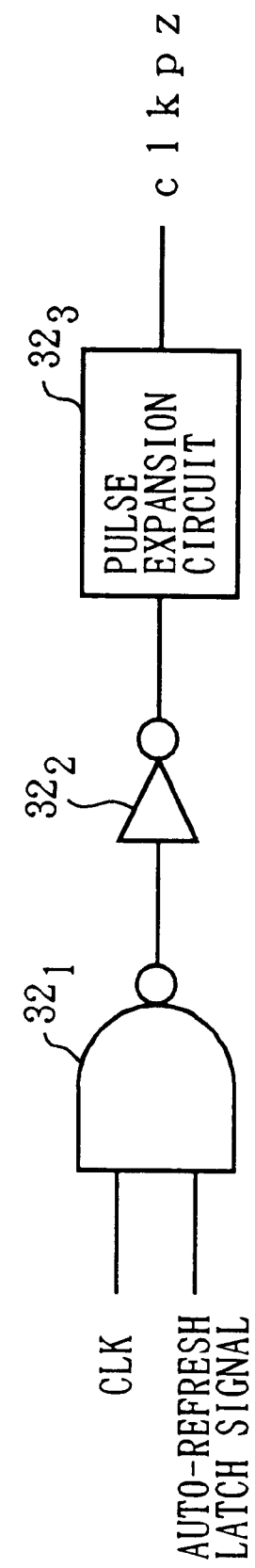
FIG. 11 is a block diagram of a pulse detector shown in FIG. 10.

FIG. 11 is a block diagram of a structure of the clock detector 32 shown in FIG. 10. The clock detector 32 is made up of a NAND gate $32_1$, an inverter $32_2$ and a pulse expansion circuit $32_3$. The NAND gate $32_1$ performs a NAND operation on the clock signal CLK the auto-refresh latch command signal output by the auto-refresh command latch circuit 40 shown in FIG. 10. When a request for entry of the auto-refresh mode is accepted, the auto-refresh command latch circuit 36 outputs the latch signal which is high. When the clock enable signal CKE is switched to the high level, and the first pulse of the clock signal CLK is applied, the auto-refresh command latch signal is switched to the low level. This is detected by the NAND gate $32_1$, the output of which is inverted by the inverter $32_2$. The pulse expansion circuit $32_3$ expands the pulse duration of the output signal of the inverter $32_2$ to a given pulse duration. An output signal clkpz of the pulse expansion circuit $32_3$ is applied to the auto-refresh command latch circuit 36 as the first reset signal.

Turning now to FIG. 10, an internal clock generator 47 generates an internal clock (which corresponds to an internal clock clkmpy shown in FIG. 12) from the clock signal CLK and the clock enable signal CKE. The internal clock generator 47 stops generating the internal clock when the clock enable signal CKE is low or a supply of the clock signal CLK is stopped. The internal clock thus generated is supplied to an initial value setting circuit 50 via the NAND gate 49. The output signal of the NAND gate 49 resets the counter 48, and sets an initial value in the initial value setting circuit 50. The initial value corresponds to the aforementioned given constant period $T_{c1}$.

Figure 12:
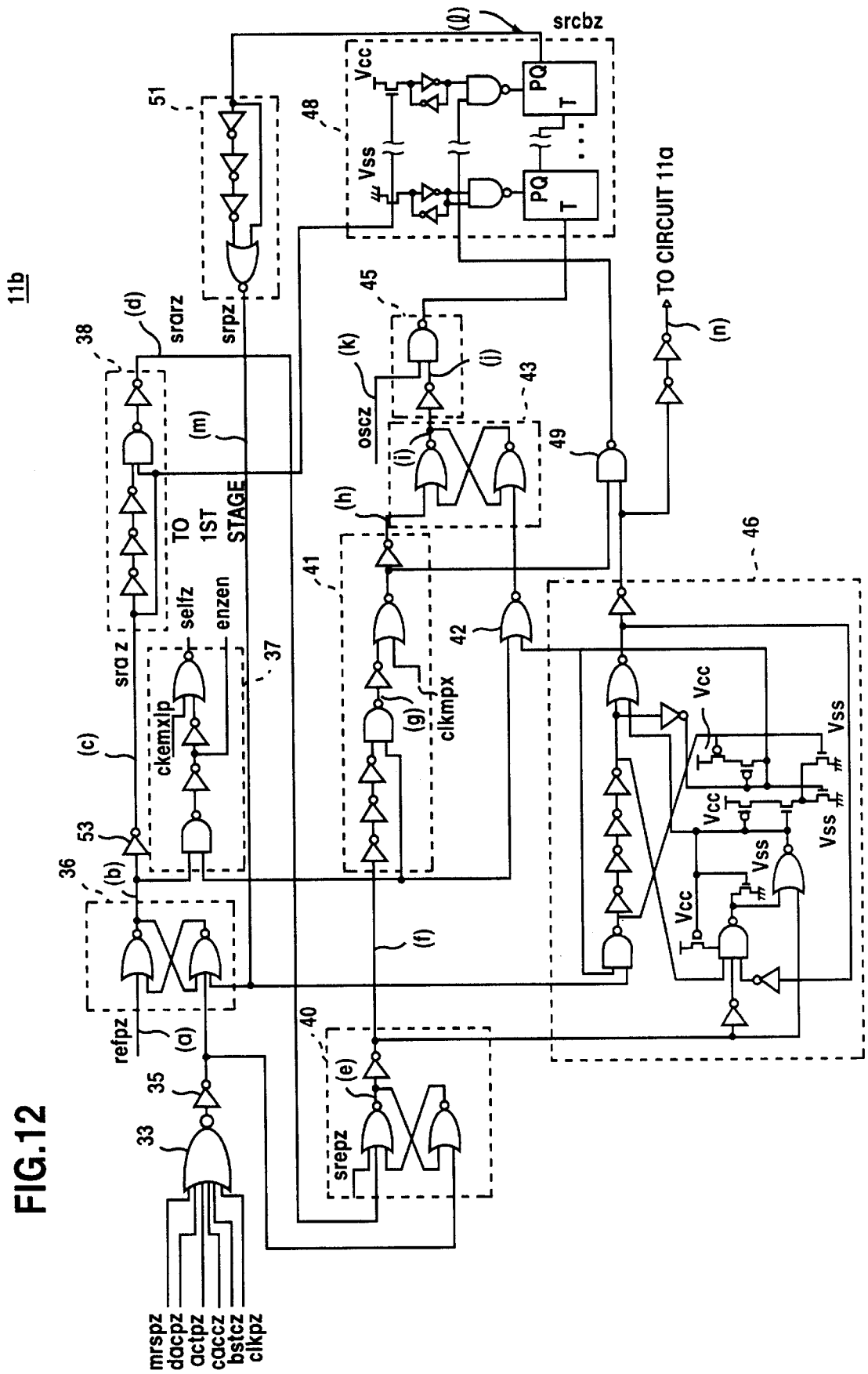
FIG. 12 is a circuit diagram of the self-refresh controller shown in FIG. 10.

FIG. 12 is a circuit diagram of the structure of the self-refresh controller 11b shown in FIG. 10. The decoded signals mrspz, dacpz, actpz, caccz and bstcz which are supplied to the OR gate 33. The signal clkpz is generated by the clock detector 32 shown in FIG. 11. The decoded signal refpz, which is output by the NOR gate $14_{12}$ shown in FIG. 9, is applied, as the set signal, to the auto-refresh command latch circuit 36. The decoded signal srepz, which is output by the NOR gate $14_{13}$ shown in FIG. 9, is applied, as the second set signal, to the self-refresh command latch circuit 40. A signal ckemxlp applied to the input first-stage disable circuit 37 is disabled when the clock enable signal CKE is high. Signals selfz and enzen output by the circuit 37 are applied to the corresponding input first-stage circuits of the blocks 14, 15 and 16 shown in FIG. 1.

Figure 13:
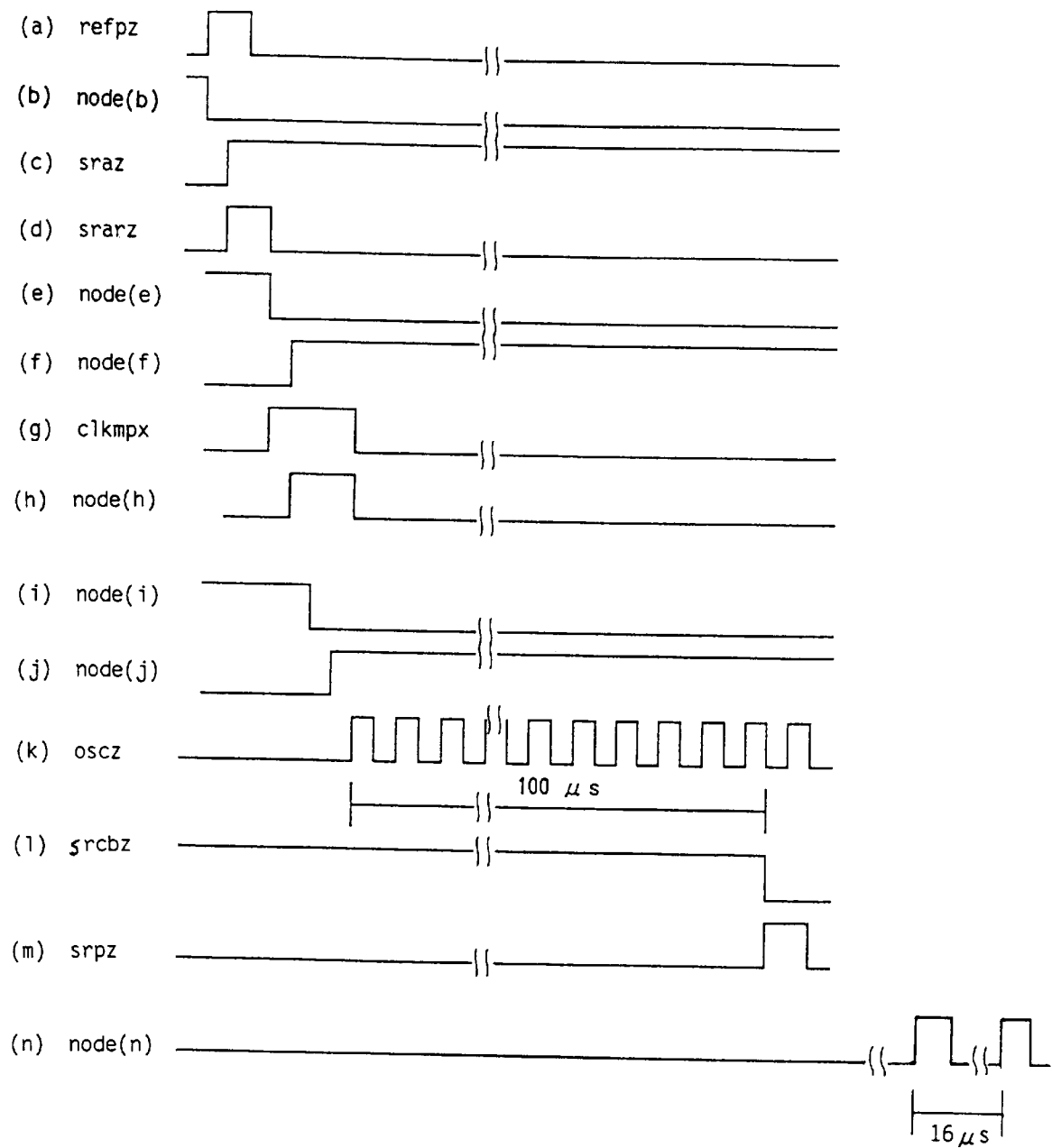
FIG. 13 is a timing chart of an operation of the self-refresh controller shown in FIG. 12.

FIG. 13 is a timing chart of an operation of the circuit shown in FIG. 12. Parts (a) through (n) of FIG. 13 correspond to signals obtained at nodes (a) through (n) shown in FIG. 12. When the auto-refresh command is applied to the command decoder 14 shown in FIG. 1, the decoded signal refpz (a) which serves as the set signal is applied to the auto-refresh command latch circuit 36. In response to the set signal refpz, the auto-refresh command latch circuit 36 is set and outputs the command latch signal as shown in part (b) of FIG. 13. The command latch signal is inverted by an inverter 53 shown in FIG. 12, and a signal sraz shown in part (c) of FIG. 13 is applied to the one-shot-pulse generator 38. The one-shot-pulse generator 38 generates a pulse signal srarz from the signal sraz, as shown in part (d) of FIG. 13, the pulse signal srarz being applied to the self-refresh command latch circuit 40 as the first set signal. Thus, the self-refresh command latch circuit 40 is set, and the output signal of a flip-flop provided therein is switched to the low level, as shown in part (e) of FIG. 13. Then, the output signal of the self-refresh command latch circuit 40 is switched to the high level, as shown in part (f) of FIG. 13.

The latch signal output by the self-refresh command latch circuit 40 is applied to the one-shot-pulse generator 41, which is supplied with the internal clock clkmpx shown in part (g) of FIG. 13. The one-shot-pulse generator 41 generates a pulse signal, as shown in part (h) of FIG. 13. The pulse signal shown in part (h) of FIG. 13 sets the self-refresh state latch circuit 43, and the output signal thereof is switched to the low level, as shown in part (i) of FIG. 13. The clock transfer circuit 45 receives the pulse signal shown in part (i) of FIG. 13, so that the output signal of an inverter provided therein is switched from the low level to the high level, as shown in part (j) of FIG. 13. Thus, the clock signal oscz shown in part (k) of FIG. 13 generated by the clock generator 44 shown in FIG. 10 is allowed to be transferred to the counter 48.

The counter 48 counts the signal oscz and, switches its output signal srcbz to the low level when the count value becomes equal to a given number of pulses corresponding to the given constant period $T_{c1}$ (equal to, for example, 100 μs), as shown in part (1) of FIG. 13. The one-shot-pulse generator 51 generates the pulse signal srpz from the signal srcbz, as shown in part (m) of FIG. 13. The pulse signal srpz thus generated is applied, as the second reset signal, to the auto-refresh command latch circuit 36, so that entry of the auto-refresh mode is released. As has been described previously, the pulse signal srpz is output to the arbiter 46. Then, the counter 48 is reset by the output signal of the NAND gate 49 so that it counts a given number of pulses of the signal oscz equal to, for example, 16 μs. Then, as shown in part (n) of FIG. 13, a pulse signal is intermittently generated every 16 μs. This pulse signal is applied to the control signal generating circuit 11a shown in FIG. 1, so that the row-related controller 11c is operated in the self-refresh mode.

The self-refresh mode which is set in the above manner is released (reset) as follows. In order to release the SDRAM device from the self-refresh mode, the clock enable signal CKE applied to the clock detector 32 is switched to the high level, and the signal ckemxlp supplied to the first-stage disable circuit 37 is switched to the high level. Hence, the first-stage circuits controlled by the circuit 37 are released from the disabled state. Thereafter, the NAND gate $32_1$ of the clock detector 32 shown in FIG. 11 receives the clock signal CLK, and the one-shot pulse signal clkpz is generated in response to the first appearance of the clock signal CLK, and is applied to the NOR gate 33. The pulse signal clkpz resets the auto-refresh command latch circuit 36 and the self-refresh command latch circuit 40. The change of the output signal of the latch circuit 40 passes through the reset signal block circuit 42, and is applied, as the reset signal, to the self-refresh state latch circuit 43. Thus, the state latched by the latch circuit 43 is released, and the supply of the clock signal from the clock generator 44 is stopped. Further, the counter 48 is caused to stop operating. The above change of the output signal of the latch circuit 40 is applied to the arbiter 46. If the DRAM core is being accessed and cannot be released from the self-refresh mode immediately, the arbiter 46 outputs the arbitration signal to the reset signal block signal 42 for the given time. Then, the self-refresh mode is released.

Figure 14:
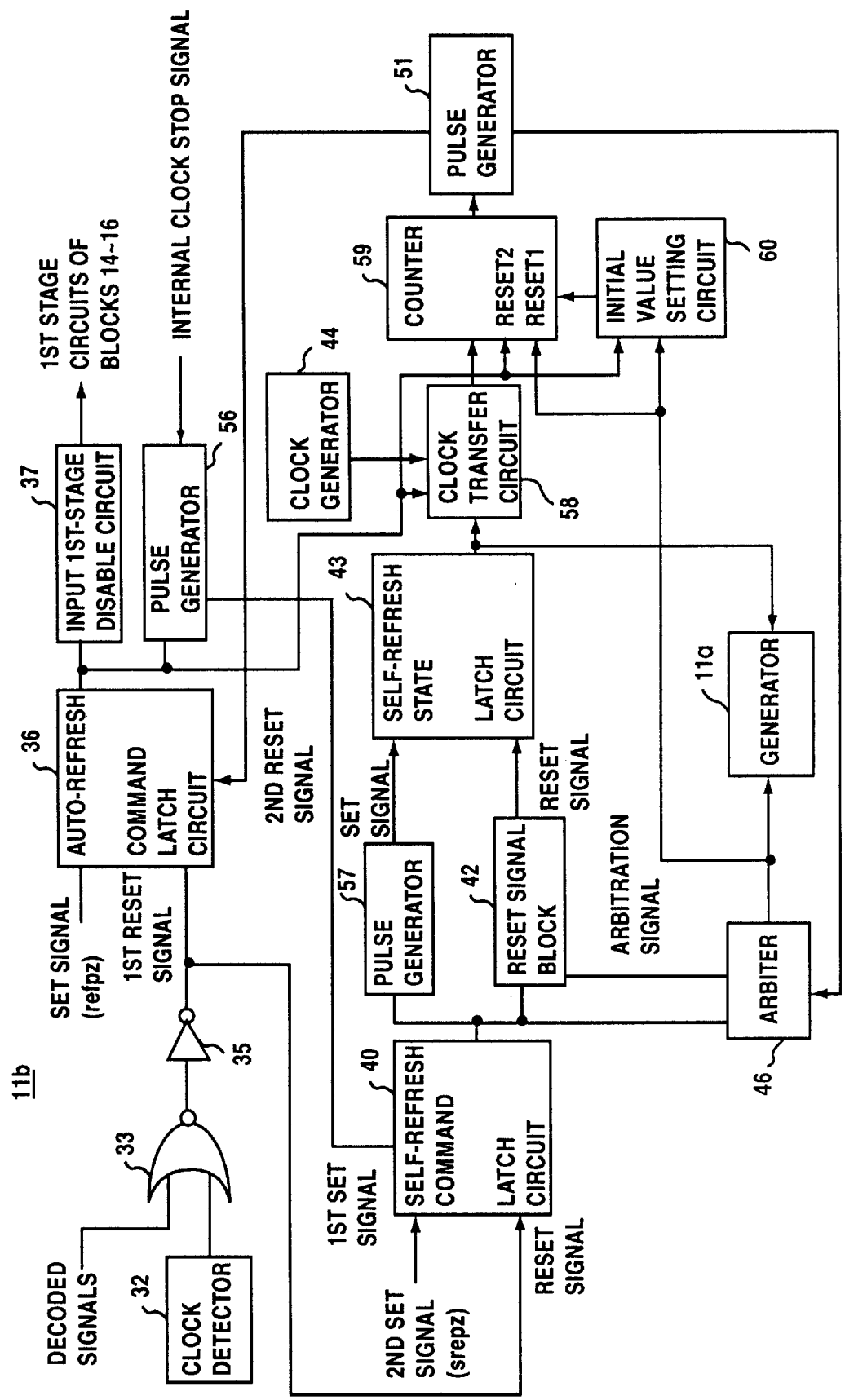
FIG. 14 is a block diagram of another structure of the self-refresh controller shown in FIG. 1.

FIG. 14 is a block diagram of another structure of the self-refresh controller 11b different from the structure shown in FIG. 10. In FIG. 14, parts that are the same as those shown in the previously described figures are given the same reference numbers. The structure can be applied to the operation in which the constant period $T_{c1}$ starts from the time when entry of the auto-refresh mode is recognized.

The structure shown in FIG. 14 differs from that shown in FIG. 10 as follows. In order to start to measure the constant period $T_{c1}$ when the auto-refresh mode is entered, the output signal of the auto-refresh command latch circuit 36 is applied to not only a one-shot-pulse generator 56 but also a clock transfer circuit 58 and an initial value setting circuit 60. That is, when the auto-refresh command is detected, the clock signal output by the clock generator 44 is applied to a counter 59 via the clock transfer circuit 58. An internal clock stop instruction signal, which is the aforementioned signal clkmpx, is applied to the one-shot-pulse generator 56, which generates the first set signal when the clock enable signal CKE switches to the low level. The clock enable signal CKE switches to the low level before the count value of the counter 59 becomes the given value. When the internal clock stop instruction signal is applied to the one-shot-pulse generator 56, it outputs the first set signal, and thus the self-refresh command latch circuit 40 is set.

Figure 15:
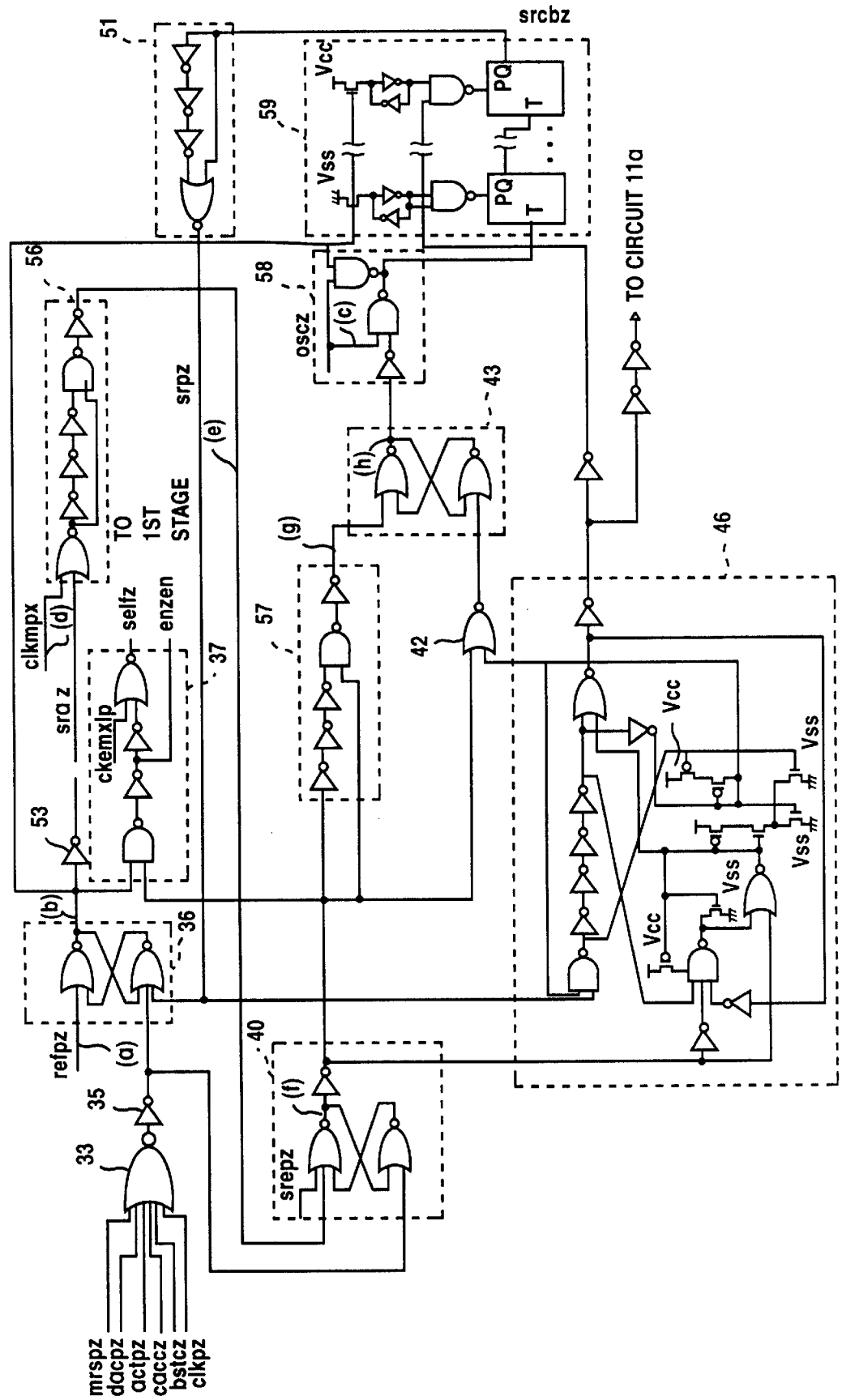
FIG. 15 is a circuit diagram of the structure of the self-refresh controller shown in FIG. 14.

FIG. 15 is a circuit diagram of the self-refresh controller 11b shown in FIG. 14. As shown in FIG. 15, the output signal of the auto-refresh command latch circuit 36 is applied to the clock transfer circuit 58 and the counter 59 (including the initial value setting circuit 60). The internal clock stop instruction signal clkmpx is applied to the one-shot-pulse generator 56.

FIG. 16 is a timing chart of an operation of the circuit shown in FIG. 15, in which a sequence from the detection of the request for entry of the auto-refresh command to the entry of the self-refresh mode is shown. Parts (a) through (h) of FIG. 16 correspond to the signals obtained at nodes (a) through (h) shown in FIG. 15.

When the auto-refresh command is decoded by the command decoder 14, the decoded signal refpz shown in part (a) of FIG. 16 is applied to the auto-refresh command latch circuit 36, the output signal of which is switched to the low level, as shown in part (b) of FIG. 16. The command latch signal shown in part (b) of FIG. 16 is applied to the one-shot-pulse generator 56, the clock transfer circuit 58 and the counter 59. When the above command latch signal is applied to a NAND gate of the clock transfer circuit 58, the clock signal oscz generated by the clock generator 44 passes through the clock transfer circuit 58, and is supplied to the counter 59. When the count value becomes equal to the given value (equal to, for example, 100 μs), the signal srcbz (not shown in FIG. 16 but shown in part (1) of FIG. 13) is output by the counter 59. Then, the pulse signal srpz is generated from the signal srcbz by the one-shot-pulse generator 51, as shown in part (m) of FIG. 13, and is applied to the auto-refresh command latch circuit 36 as the second reset signal. Hence, the command latch signal shown in part (b) of FIG. 16 is switched to the high level.

The counter 59 reaches the count value equal to 100 μs only when the internal clock stop instruction signal clkmpx does not change to the low level. As has been described previously, the internal clock stop instruction signal clkmpx changes only when the clock enable signal CKE changes to the low level or a supply of the clock signal CLK is stopped. If the internal clock stop instruction signal clkmpx changes to the low level at any time before the count value of the counter 59 reaches the count value equal to 100 μs, as shown in part (d) of FIG. 16, the pulse shown in part (e) of FIG. 16 is generated and is applied, as the decoded self-refresh command signal (or the first set signal), to the self-refresh command latch circuit 40.

Thus, the self-refresh command latch circuit 40 is set, and the output signal thereof is switched to the low level, as shown in part (f) of FIG. 16. Then, a one-shot pulse signal shown in part (g) of FIG. 16 is generated from the above output signal by the one-shot-pulse generator 57. The self-refresh state latch circuit 43 latches the set signal shown in part (g) of FIG. 16, and the output signal thereof is switched to the low level as shown in part (h) of FIG. 16. Even in this state, the clock signal oscz is continuously output to the counter 59 via the clock transfer circuit 58 until the latched state of the auto-refresh command is released.

The operation of the arbiter 46 carried out when the self-refresh command latch circuit 40 is set is the same as that which has been described with reference to FIGS. 10 through 13.

The self-refresh mode thus set can be released as follows. In order to release the SDRAM device from the self-refresh mode, the clock enable signal CKE applied to the clock detector 32 is switched to the high level, and the signal ckemxlp supplied to the first-stage disable circuit 37 is switched to the high level. Hence, the first-stage circuits controlled by the circuit 37 are released from the disabled state. Thereafter, the NAND gate $32_1$ of the clock detector 32 shown in FIG. 11 receives the clock signal CLK, and the one-shot pulse signal clkpz is generated in response to the first appearance of the clock signal CLK, and is applied to the NOR gate 33. The pulse signal clkpz resets the auto-refresh command latch circuit 36 and the self-refresh command latch circuit 40. The change of the output signal of the latch circuit 40 passes through the reset signal block circuit 42, and is applied, as the reset signal, to the self-refresh state latch circuit 43. Thus, the state latched by the latch circuit 43 is released, and the supply of the clock signal from the clock generator 44 is stopped. Further, the counter 59 is caused to stop operating. The above change of the output signal of the latch circuit 40 is applied to the arbiter 46. If the DRAM core is being accessed and cannot be released from the self-refresh mode immediately, the arbiter 46 outputs the arbitration signal to the reset signal block circuit 42 for the given time. Then, the self-refresh mode is released.

As described above, according to the present invention, it is possible to certainly recognize a request for entry of the self-refresh mode even if the clock enable signal CKE has a heavy load and lags behind the signals which define the self-refresh mode together with the clock enable signal CKE.

The present invention is not limited to the specifically described embodiments, and variations and modifications may be made without departing from the scope of the present invention.

What is claimed is:

1. A semiconductor memory device operable in synchronism with a clock signal externally supplied thereto, said semiconductor memory device comprising:

a first part which detects a state of a predetermined signal after a given command, not being indicative of a self-refresh command, is input to the semiconductor memory; and a second part which sets, on the basis of the state of the predetermined signal, the semiconductor memory device to a self-refresh mode.

2. The semiconductor memory device as claimed in claim 1, wherein:

said predetermined signal is a clock enable signal which indicates whether the clock signal should be received by the semiconductor memory device; and the second part sets the semiconductor memory device to the self-refresh mode when the clock enable signal has a predetermined state change after the given command is input to the semiconductor memory device.

3. The semiconductor memory device as claimed in claim 1, wherein:

said predetermined signal is a signal which cancels entry of the self-refresh mode; and the second part sets the semiconductor memory device to the self-refresh mode when there is no signal which cancels entry of the self-refresh mode during a given period after the given command is input to the semiconductor memory device.

4. A semiconductor memory device operable in synchronism with a clock signal externally supplied thereto, said semiconductor memory device comprising:

a first part which detects a state of a predetermined signal after a given command is input to the semiconductor memory: and a second part which sets, on the basis of the state of the predetermined signal, the semiconductor memory device to a self-refresh mode in which a refresh operation is carried out without an external signal.

wherein said predetermined signal corresponds to said clock signal externally applied to the semiconductor device; and the second part sets the semiconductor memory device to the self-refresh mode when said clock signal is fixed to a predetermined level during a given period after the given command is input to the semiconductor memory device.

5. The semiconductor memory device as claimed in claim 4, wherein said given period starts from a time at which the given command is input to the semiconductor memory device.

6. The semiconductor memory device as claimed in claim 3, wherein said given period starts from a time at which said predetermined state change of the clock enable signal occurs.

7. The semiconductor memory device as claimed in claim 4, wherein said given period starts from a time at which said clock signal is fixed to the predetermined level after the given command is input to the semiconductor memory device.

8. The semiconductor memory device as claimed in claim 1, wherein said given command is a command which requests for entry of an auto-refresh mode in which the refresh operation is carried out with an external signal.

9. The semiconductor memory device as claimed in claim 1, further comprising a third part which disables, when the self-refresh mode is set, a circuit which receives signals externally supplied to the semiconductor memory device and other than the clock signal and clock enable signal.

10. The semiconductor memory device as claimed in claim 1, wherein the second part releases the semiconductor memory device from the self-refresh mode in response to a command which requests a release of the self-refresh mode.

11. A semiconductor memory device receiving a clock signal and control signals and having first and second operation modes, comprising:

a first circuit that generates a first mode signal indicating the first operation mode on the basis of the control signals; and a second circuit that operates in response to the first mode signal and generates a second mode signal indicating the second operation mode in response to a state of at least one of the control signals or the clock signal, when the second mode signal is generated by the second circuit, the first operation mode not being performed and instead the second operation mode being performed.

* * * * *